(12) United States Patent
Rink et al.

(10) Patent No.: US 7,625,826 B2
(45) Date of Patent: Dec. 1, 2009

(54) METHOD OF MANUFACTURING A SEMICONDUCTOR DEVICE AND AN APPARATUS FOR USE IN SUCH A METHOD

(75) Inventors: Ingrid Annemarie Rink, Nijmegen (NL); Reinoldus Bernardus Maria Vroom, Nijmegen (NL)

(73) Assignee: NXP B.V., Eindhoven (NL)

( * ) Notice: Subject to any disclaimer, the term of this patent is extended or adjusted under 35 U.S.C. 154(b) by 398 days.

(21) Appl. No.: 10/563,924

(22) PCT Filed: Jul. 8, 2004

(86) PCT No.: PCT/IB2004/051166

§ 371 (c)(1),
(2), (4) Date: Jan. 9, 2006

(87) PCT Pub. No.: WO2005/006410

PCT Pub. Date: Jan. 20, 2005

(65) Prior Publication Data

US 2006/0153331 A1 Jul. 13, 2006

(30) Foreign Application Priority Data

Jul. 11, 2003 (EP) .................................. 03102115
Oct. 23, 2003 (EP) .................................. 03103918

(51) Int. Cl.
*H01L 21/302* (2006.01)
(52) U.S. Cl. ........................ 438/756; 438/745; 438/754; 134/1.1
(58) Field of Classification Search ................ 438/745, 438/750, 752, 754, 756; 134/1.1, 1.2, 3
See application file for complete search history.

(56) References Cited

U.S. PATENT DOCUMENTS

| | | | | |
|---|---|---|---|---|
| 4,116,714 | A | * | 9/1978 | Basi ............................... 134/3 |
| 6,136,767 | A | | 10/2000 | Hineman et al. |
| 6,235,406 | B1 | * | 5/2001 | Uzoh .......................... 428/620 |
| 6,352,082 | B1 | * | 3/2002 | Mohindra et al. .......... 134/25.4 |
| 6,541,321 | B1 | | 4/2003 | Buller |
| 6,635,582 | B2 | * | 10/2003 | Yun et al. .................... 438/745 |
| 6,833,081 | B2 | * | 12/2004 | Chen et al. ................... 216/100 |

(Continued)

FOREIGN PATENT DOCUMENTS

EP 0 789 389 8/1997

(Continued)

*Primary Examiner*—Lan Vinh

(57) ABSTRACT

The invention relates to a method of manufacturing a semiconductor device (10) with a substrate (1) and a semiconductor body (11) which comprises at least one semiconductor element, wherein, after formation of the element, a layer structure is formed which comprises at least one electrically insulating layer (2) or an electrically conductive layer (3), wherein an opening is formed in the layer structure with the aid of a patterned photoresist layer (4) and an etching process, wherein residues are formed on the surface of the semiconductor body (11) during the etching process, and wherein the photoresist layer (4) is ashed, after the etching process, by means of a treatment with an oxygen-containing compound, after which the surface is subjected to a cleaning operation using a cleaning agent comprising a diluted solution of an acid in water and being heated to a temperature above room temperature, thereby causing the residues formed to be removed. According to the invention, sulphuric acid is chosen as the acid for the cleaning agent.

14 Claims, 4 Drawing Sheets

U.S. PATENT DOCUMENTS

Figure 1:
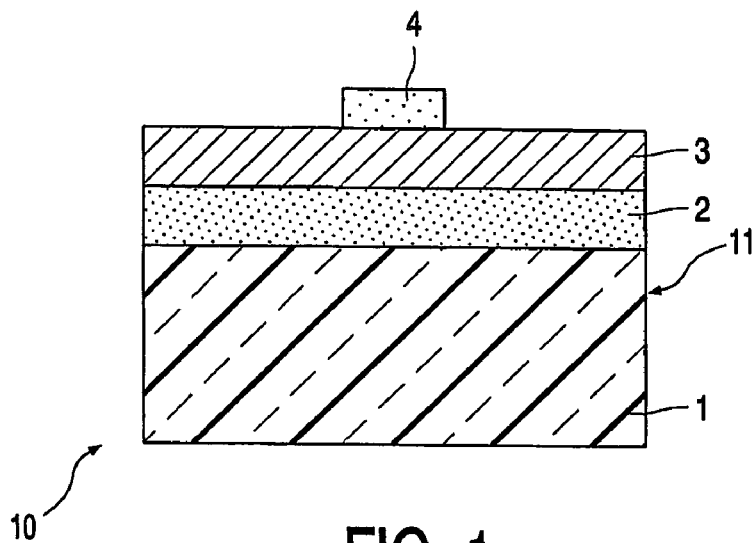

| | | |
|---|---|---|
| 6,964,929 B1 * | 11/2005 | Narayanan et al. .......... 438/745 |
| 7,078,351 B2 * | 7/2006 | Chiu et al. ................. 438/736 |
| 7,159,599 B2 * | 1/2007 | Verhaverbeke et al. ...... 134/109 |
| 2001/0023109 A1 | 9/2001 | Yamamoto |
| 2001/0027799 A1 * | 10/2001 | Bergman ....................... 134/3 |

FOREIGN PATENT DOCUMENTS

| WO | WO 97/50019 | 12/1997 |
|---|---|---|

* cited by examiner

METHOD OF MANUFACTURING A SEMICONDUCTOR DEVICE AND AN APPARATUS FOR USE IN SUCH A METHOD

The invention relates to a method of manufacturing a semiconductor device with a substrate and a semiconductor body which comprises at least one active semiconductor element, wherein, after the semiconductor element has been formed, a layered structure is provided comprising at least one electrically insulating layer or one electrically conductive layer, wherein an opening is formed in the layered structure by means of a patterned photoresist layer and an etch process, wherein residues are formed at the surface of the semiconductor body during the etch process, wherein the photoresist layer is ashed, after the etch process, by means of a treatment using an oxygen-containing compound, after which the surface is cleaned using a cleaning agent containing a diluted solution of an acid in water and being heated to a temperature above room temperature, as a result of which the residues formed are removed from the surface. The opening may be formed, for example in an insulating layer, as a so-termed via or as an opening to a bond pad. The formation of the opening may also comprise the removal of part of an applied conductive layer, such as a metal layer, in which case the remaining parts of the conductive layer form, for example, connection conductors. Such a method has the advantage that the cleaning agent used is comparatively inexpensive, safe in use and, when it is disposed of, its burden on the environment is small.

The invention further relates to an apparatus for use in such a method.

A method of the type mentioned in the opening paragraph is known from United States patent specification with publication number U.S. Pat. No. 6,136,767, published on 24 Oct. 2000. In said document a description is given of a method wherein, after the formation of an electric connection region, such as a metal-filled via, the photoresist layer used in an etch process is removed by means of ashing using, for example, an oxygen treatment. After this treatment, however, undesirable residues of organic or inorganic nature are left behind on the surface of the semiconductor body. In said patent specification it is proposed to clean the surface by using a cleaning agent containing a water-diluted solution of acetic acid and phosphoric acid. According to said specification, the phosphoric acid is excellently suitable for removing inorganic residues, and the acetic acid is suitable, in particular, for removing the organic residues. A typically suitable concentration would be approximately 5% by volume for both acids. A suitable operating temperature during the cleaning operation would be approximately 30 to 45° C. The method is suitable, in particular, for the so-termed BEOL (=back-end of line) phase of the production process wherein, after the semiconductor element, which in practice commonly takes the form of a large number of transistors for a so-termed IC, has been formed in the semiconductor body by means of a layered structure of one or more electrically insulating inorganic layers and one or more conductive layers, generally of metal, connection conductors or connection regions such as so-termed bond pads are formed.

A drawback of the known method, particularly in the case of large-scale mass production, resides in that it is still comparatively expensive and imposes a certain burden on the environment.

The object of the present invention therefore is to provide a method which is particularly effective in removing residues and, apart from being inexpensive, hardly imposes any burden on the environment.

To achieve this, a method of the type mentioned in the opening paragraph is characterized in accordance with the invention in that sulphuric acid is chosen as the acid in the cleaning agent.

Surprisingly it has been found that a diluted solution of sulphuric acid in water, at an increased temperature, on the one hand very effectively removes the residues formed during etching and remaining on the surface after ashing the resist layer, while on the other hand most of the metals used as a conductor in a connection region, such as aluminum or an alloy of aluminum, or titanium (nitride) remain substantially unaffected in this process. This is surprising, inter alia, in view of the fact that the PCT patent specification published under number WO 97/50019 on 31 Dec. 1997 asserts (see page 1) on the contrary that sulphuric acid or mixtures thereof are suitable in concentrated form for the BEOL phase because concentrated acids such as sulphuric acid are not corrosive to metals provided that the water concentration is low. In the method in accordance with the invention, however, the solution used is a highly diluted solution of sulphuric acid in water. Concentrations that were found to be suitable lie in the range between 0.01% by weight and 10% by weight. Good results are achieved in the range between 0.5 and 5% by weight, for example at a concentration of 2.5% by weight. As the specific weight of sulphuric acid is approximately 2 $g/cm^3$, this corresponds to a volume concentration of approximately 1%. This means that a method in accordance with the invention is particularly inexpensive and environmentally friendly because only a very small amount of the acid used is sufficient to obtain a good result. The waste produced as a result of the method can be readily purified by adding, preferably an equivalent quantity of, calcium ions since calcium sulphate is substantially insoluble and subsequently precipitates. A simple filtration process then suffices to separate the calcium sulphate formed and the water. In the known method, which uses acetic acid, this is not possible because the inorganic salts of acetic acid only dissolve well in water. If calcium hydroxide is used as the source of calcium ions, it is further possible to simultaneously bring the degree of acidity to an approximately neutral value in a simple manner.

The invention is further also based on the recognition that inorganic dielectrics, such as silicon oxide, silicon nitride and silicon oxynitride are excellently resistant to mineral acids with the exception of HF. The method in accordance with the invention can also be advantageously applied, however, if organic dielectrics are present in the semiconductor device to be manufactured.

In a preferred embodiment of a method in accordance with the invention use is therefore made of a cleaning agent that uses only sulphuric acid and (demineralized) water. With respect to a cleaning agent which comprises hydrogen peroxide in addition to sulphuric acid and demineralized water, such a cleaning agent has the advantage that it substantially does not attack layers of Ti and/or TiN which are often used as so called liner and/or as an anti-reflective coating. For these purposes the layer of Ti and/or TiN may be arranged below and/or above a layer of aluminum or aluminum alloy which serves as an interconnect layer. Alternatively, or in addition, the layer of Ti and/or TiN may be arranged around a layer of aluminum or aluminum alloy which serves as a via or plug. Attack of any of these layers of Ti and/or TiN may lead to a malfunctioning electric device and hence to a reduced yield.

Another advantage of a cleaning agent which does not comprise hydrogen peroxide in addition to sulphuric acid and demineralized water with respect to a cleaning agent which does comprise hydrogen peroxide in addition to sulphuric acid and demineralized water, is that the former is able to remove relatively thick layers of residues.

In another favorable embodiment use is made of a cleaning agent which besides, a low concentration of, sulphuric acid and water also contains phosphoric acid, preferably also in a comparable low weight concentration. Dependent on the circumstances, this enables better results to be achieved while the cost price as well as the load on the environment remain low; after all, also in the above treatment with calcium ions the phosphate ions are precipitated in the form of calcium phosphate which, like calcium sulphate, is (substantially) insoluble in water. A phosphoric acid concentration that proved suitable lies in the range between 0.01 and 5% by weight, and preferably between 0.1 and 1% by weight. As the specific weight of phosphoric acid also is approximately 2 g/cm$^3$, this means also that the volume concentration is very low.

In a method in accordance with the invention, the cleaning process is preferably carried out at a temperature in the range between room temperature, i.e. 20° C., and 60° C. Very good results have been achieved using a temperature between 30 and 45° C. A suitable treatment time lies in the range between 2 and 30 minutes and depends on the nature of the connection region formed: the treatment time for a metal track preferably ranges between 2 and 5 minutes, for a via it ranges between 10 and 30 minutes, and for a so-termed bond pad it ranges between 2 and 15 minutes.

In a further favorable embodiment the cleaning agent is treated with hot demineralized water after the cleaning step using the cleaning agent on the basis of sulphuric acid or on the basis of sulphuric acid and phosphoric acid. It has been found that residues left behind after the resist layer has been ashed can also be largely removed with demineralized water, provided the water is hot enough. In certain cases, the sulphuric acid may be omitted. A temperature that proved to be suitable for this purpose lies in the range between 60 and 90° C. and preferably between 70 and 75° C. By a combination of said measures, the total amount of cleaning time necessary can be somewhat reduced. Rinsing using demineralized water is known per se and commonly applied, however, the demineralized water used is at room temperature. As the treatment with sulphuric acid or sulphuric acid and phosphoric acid must also take place at an elevated temperature, said rinsing with hot demineralized water can be carried out readily from an energy point of view. In addition, said rinsing operation does not mean an additional step since rinsing with cold demineralized water after a cleaning operation is customary already.

In a particularly attractive modification of a method in accordance with the invention, said cleaning step using the cleaning agent is followed by a rinsing step using demineralized water, and this sequence, which includes a cleaning step and a rinsing step, is repeated a number of times. For the rinsing step use is preferably made of demineralized water of ambient temperature. The number of times that the cleaning-rinsing sequence is repeated is preferably chosen to be between 2 and 4. Surprisingly it has been found that such a method gives, on the one hand, excellent cleaning results while, on the other hand, the overall amount of time that it takes can be very small. For example, a cleaning step using diluted sulphuric acid heated to 45 degrees Celsius, which is carried out for 30 to 60 seconds, preferably 30 seconds, followed by a rinsing step using demineralized water of room temperature for 20 seconds, proved to be very suitable in said respects if said cleaning-rinsing cycle was repeated 2 to 4 times, in some cases even 5 or more times, e.g. up to 7. If the results after 4 times is not satisfactory, it may be advantageous to increase the duration of the cleaning step using diluted sulphuric acid and/or the temperature of the cleaning agent. In other cases, the cleaning step using diluted sulphuric acid heated to 45 degrees Celsius is carried out for 60 seconds to 240 seconds, such as 120 seconds.

Preferably, the time between producing the ash residues, which are formed during the etch process, and the cleaning using the cleaning agent is less than 48 hours, such as 24 hours or less. The inventors have gained the insight that the post ash residues can change their removability behavior, i.e. the ease of removal. This change may be particularly pronounced when the post ash residues are subjected to a relatively humid atmosphere.

A method in accordance with the invention proved to be very suitable for cleaning a semiconductor device wherein the electric connection is formed as a tungsten-filled via which is contacted, at the upper side, by means of an aluminum-containing conductor track which leaves part of the tungsten uncovered. Surprisingly it has been found that in such a case, where also tungsten is exposed to the cleaning agent, said tungsten is substantially not attacked. In other words the phenomenon known as tungsten corrosion is counteracted. This is a particularly important advantage since in present-day IC (=Integrated Circuit) processes wherein the dimensions are becoming smaller and smaller, it becomes substantially impossible to position a conductor track on a tungsten-filled via in such a manner that the conductor track fully covers said tungsten.

These and other aspects of the invention are apparent from and will be elucidated with reference to the embodiment(s) described hereinafter.

Figure 2:
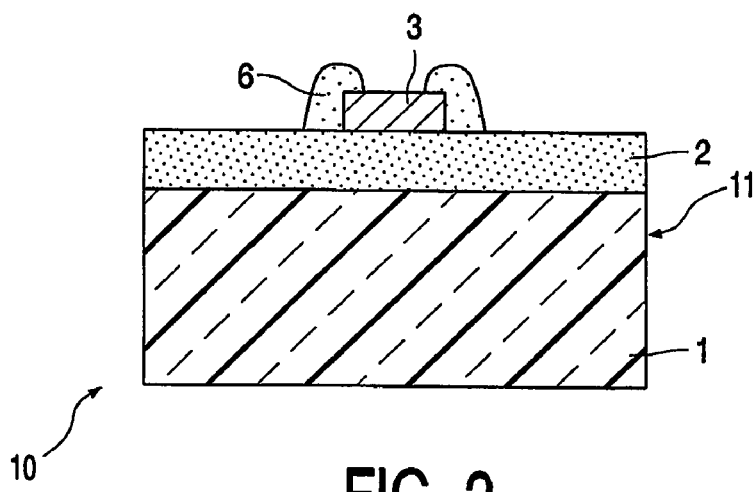
Figure 3:
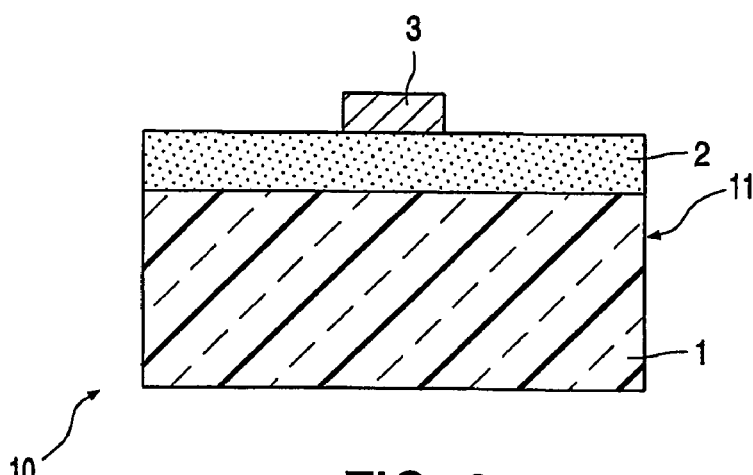
Figure 4:
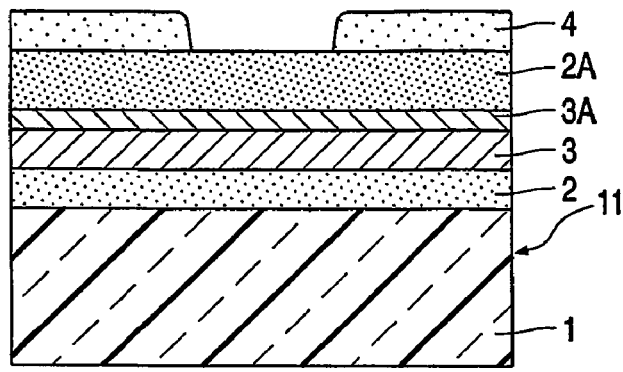
Figure 5:
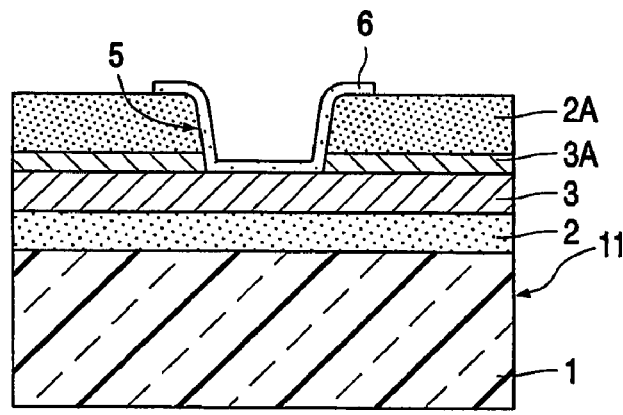
Figure 6:
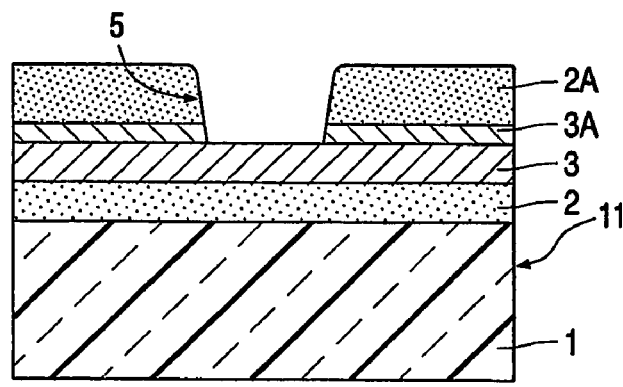
Figure 7:
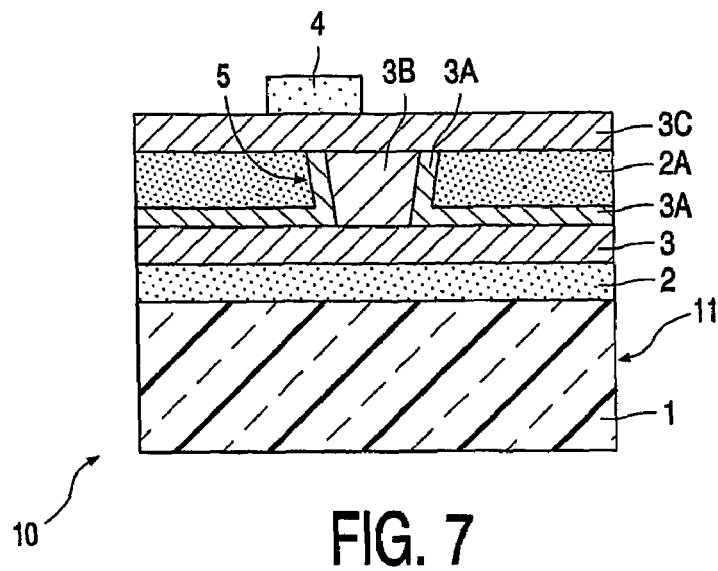
Figure 8:
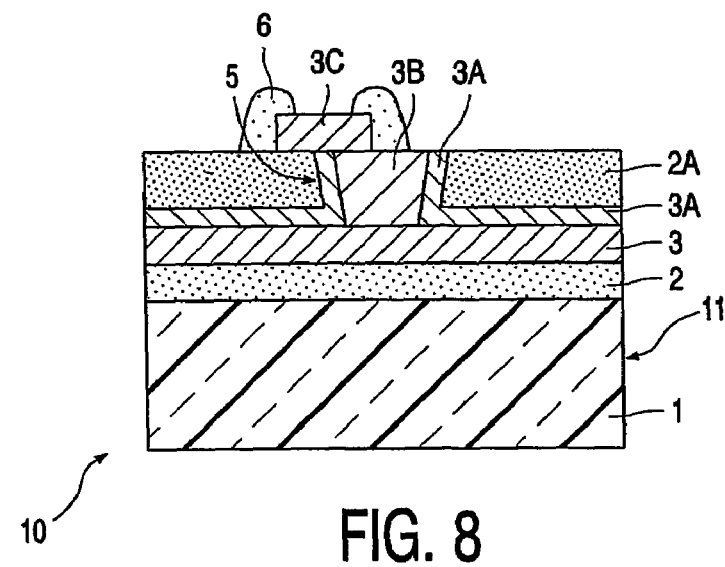
Figure 9:
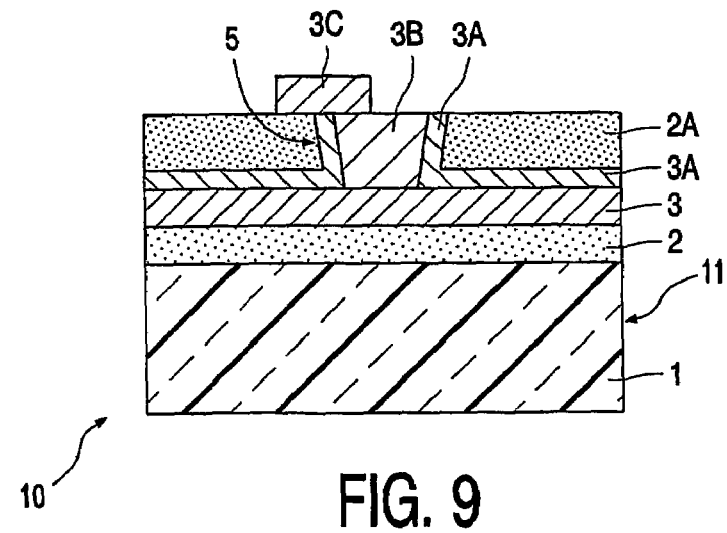

In the drawings:

FIGS. 1 through 3 are diagrammatic, cross-sectional views at right angles to the thickness direction of a semiconductor device, such as an IC, in successive stages of the manufacture using a method in accordance with the invention, FIGS. 4 through 6 are diagrammatic, cross-sectional views at right angles to the thickness direction of a semiconductor device, such as an IC, in successive stages of the manufacture using a modification of a method in accordance with the invention, and FIGS. 7 through 9 are diagrammatic, cross-sectional views at right angles to the thickness direction of a semiconductor device, such as an IC, in successive stages of the manufacture using a further modification of a method in accordance with the invention.

Figure 10:
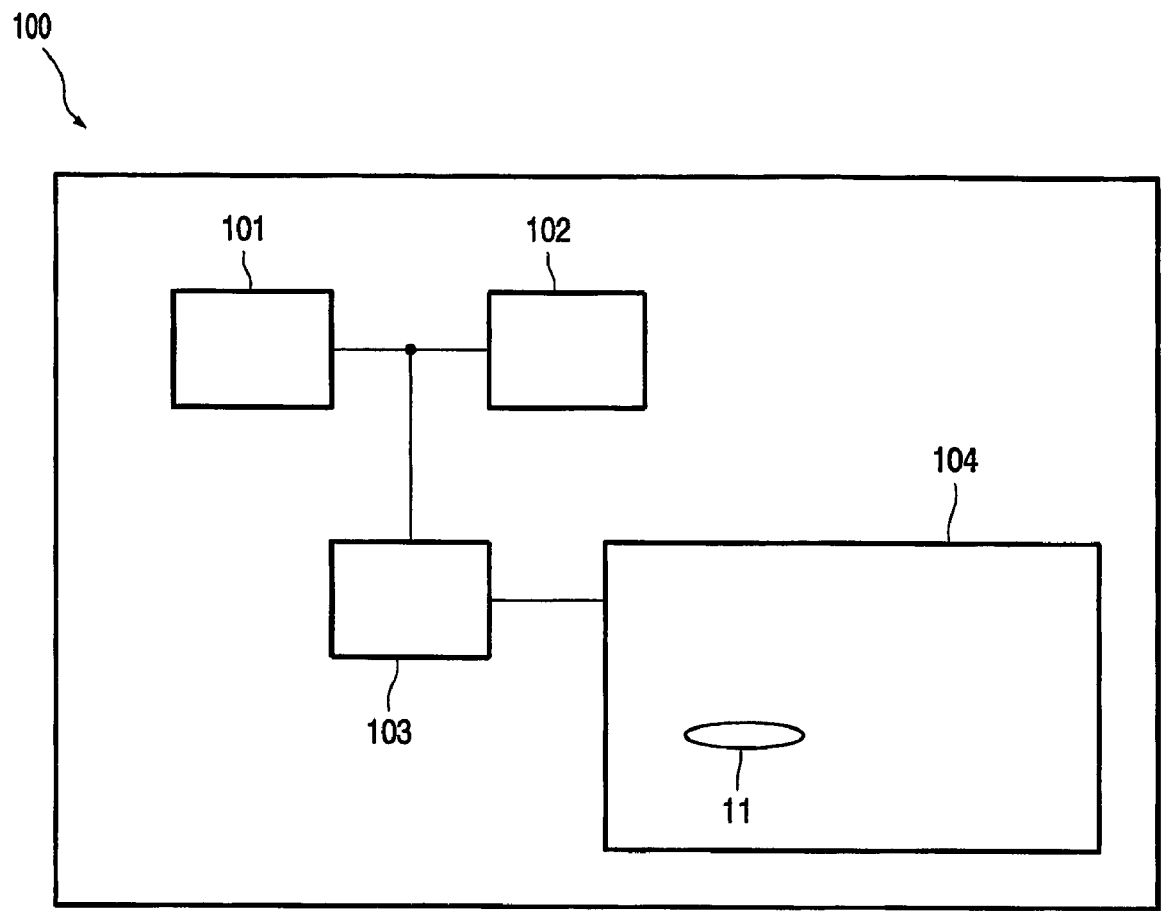

FIG. 10 is a diagrammatic representation of the apparatus according to the invention.

The Figures are not drawn to scale and some dimensions, such as dimensions in the thickness direction, are exaggerated for clarity. In the different Figures, corresponding regions or parts are indicated by means of the same reference numerals, whenever possible.

FIGS. 1 through 3 are diagrammatic, cross-sectional views at right angles to the thickness direction of a semiconductor device, such as an IC, in successive stages of the manufacture using a method in accordance with the invention. The device 10 (see FIG. 1) comprises a substrate 1 and a semiconductor body 11, not shown separately, which are made, for example, of silicon. In the semiconductor body 11, for example in one or more epitaxial silicon layers, preferably a large number of semiconductor elements such as transistors are formed in a customary manner. On the surface of the semiconductor body 11 an insulating layer 2, for example of silicon dioxide, is then provided, for example, by means of a thermal oxidation or CVD (=Chemical Vapor Deposition) process. Said insulating layer is subsequently provided, for example by means of vapor deposition or sputtering, with an aluminum (or aluminum-copper-alloy) layer 3 which may or may not be covered with a thin layer of Ti or TiN or TiW, or combinations thereof. Said layer 3 is provided with a desired pattern using a photoresist layer 4 patterned by means of photolithography. Outside the pattern (see FIG. 2) the aluminum layer 3 is removed by means of, for example, plasma etching. As a result, residues 6 are formed at the surface of the semiconductor body 11. Subsequently, the photoresist layer 4 is ashed, for example, by means of an oxygen plasma. In said process, the photoresist layer is largely removed, but the organic and/or inorganic residues 6 formed during etching are left behind on the surface of the semiconductor body 11. The residues 6 formed may cover not only the flanks of the aluminum layer 3 but also (part) of the upper side of said layer 3.

According to the invention, these residues 6 are removed, in this example, using a cleaning agent comprising 2.5% by weight sulphuric acid in demineralized water. The cleaning step is carried out at 45° C. for 2 minutes in a so-termed wet-bench machine with a static bath. SEM (=Secondary Electron Emission) recordings show (see FIG. 3) that, after the cleaning step, hardly any residues are left behind on the surface of the semiconductor body 11. These results are comparable to, or even better than, the results of a cleaning step carried out for comparison using a commercially available cleaning agent on the basis of catechol or hydroxyl amine. In another embodiment a cleaning agent comprising 5% by weight sulphuric acid and 0.5% by weight phosphoric acid was used. Also in this case, the temperature was 45° C., while the treatment time was 2 minutes. The patterned aluminum shown in FIG. 1 may be, for example, a conductor track. The results mentioned relate to a conductor track. Comparable results are obtained in the treatment of bond pads. In that case, the patterned aluminum (copper) 3 is provided with a so-termed anti-scratch protection in the form of a silicon nitride layer, not shown. Said silicon nitride layer is provided with openings using a resist pattern, not shown either, after which, i.e. after ashing of the resist, the purification step is carried out as described above. The treatment time for the diluted sulphuric acid solution was approximately 5 to 15 minutes in a wet-bench and approximately 8 minutes in a so-termed spray tool, and for the diluted mixture of sulphuric acid and phosphoric acid the treatment time was approximately 5 minutes. In all cases, the aluminum or aluminum-copper present was not, or at least hardly, attacked after the cleaning step, which means that the critical dimensions remained intact.

FIGS. 4 through 6 are diagrammatic, cross-sectional views at right angles to the thickness direction of a semiconductor device 10, such as an IC, in successive stages of the manufacture using a modification of a method in accordance with the invention. FIG. 4 shows an IC wherein a so-termed via is formed that is used in the production of ICs using the so-termed multilevel-interconnect technique. In this modification, for example a first insulating layer 2 is formed on the semiconductor body 11, and a first metal layer 3, for example of Al, Al(Cu) or W, is provided on said insulating layer. A second metal layer 3A, for example of Ti, is provided on said first metal layer. A second insulating layer 2A is provided on said second metal layer. Next, a resist layer 4 is patterned by means of photolithography, said resist layer 4 having an opening at the location of the via to be formed. Subsequently (see FIG. 5) an opening 5 is formed by means of an etch process in which the insulating layer 2A is locally removed and the resist layer 4 serves as a mask. As a result, residues 6 are formed that cover the flanks of the opening 5. Subsequently the resist layer 4 is ashed and the previously formed residues 6 may now also cover part of the insulating layer 2A. Next, a cleaning step as described above with respect to the first example is carried out. The treatment time for the diluted sulphuric acid solution as well as for the diluted sulphuric acid and phosphoric acid solution was approximately 15 minutes. In a spray tool the treatment time can be reduced to, for example, 5 minutes. The treatment temperature was, also in this case, 45° C. for both solutions. Also in this case (see FIG. 6) it is found that the residues have been removed completely. Next, the manufacture is continued by filling the via 5 with a metal plug, not shown, which is capable of making an electric connection with a further conductor layer, not shown either, which is to be provided at a later stage.

FIGS. 7 through 9 are diagrammatic, cross-sectional views at right angles to the thickness direction of a semiconductor device, such as an IC, in successive stages of the manufacture using a further modification of a method in accordance with the invention. In fact, this modification constitutes a further stage in the manufacture as discussed with respect to FIGS. 4 through 6. After the opening 5 has been formed (see FIG. 7), the walls thereof are covered with a barrier of, for example, a titanium or titanium-nitride layer 3A, and the opening 5 is filled with tungsten 3B, resulting in the formation of a via. Next, an aluminum or aluminum-copper layer 3C is applied and covered with a resist pattern 4. Subsequently (see FIG. 8) the aluminum layer 3C is locally removed by means of a plasma-etch process. As a result, residues 6 are formed which, after the subsequent ashing of the resist layer 4, may also be partly present on the aluminum layer 3. As the smallest dimensions of the IC 10 of this example are approximately 0.35 μm, it is not readily possible in practice to make the patterned aluminum 3C cover the tungsten plug 3B completely.

After the resist pattern 4 has been ashed, again a cleaning step is carried out analogous to that discussed above for cleaning after the formation of aluminum conductor tracks. Also in this case (see FIG. 9) excellent results are achieved regarding the removal of residues 6 left behind after the ashing of the resist 4, and also regarding the fact that the aluminum or aluminum-copper was not attacked. Surprisingly it has been found that also the tungsten plug 3B exposed, in this example, to the cleaning step remains substantially unattached, which is not the case if use is made of a commercially available cleaning agent. In other words, tungsten corrosion is counteracted.

In all the situations described above, the cleaning step may be advantageously combined with a cleaning-rinsing step in hot, i.e. 60 to 90° C., demineralized water. The treatment times of the acid cleaning operation may then often be shorter in practice than the above-stated times. Good results are achieved using demineralized water of, for example, 70 to 75° C. In the examples given, the manufacture of the IC is continued, of course, in a customary manner. The formation of a bond pad, as described hereinabove, will frequently correspond to a last stage. Individual semiconductor bodies 10, which are generally manufactured simultaneously in large numbers, are then obtained using a separation technique, such as sawing, after which they are suitable for final assembly.

It is also noted that in all the situations described above, the cleaning step, followed by a rinsing step using demineralized water of preferably ambient temperature, may be advantageously repeated a number of times. For example, a cleaning step using diluted sulphuric acid heated to 45 degrees Celsius, which is carried out for 30 to 60 seconds, preferably 30 seconds, followed by a rinsing step using demineralized water of room temperature for 20 seconds proved very suitable if the cycle is repeated 2 to 4 times. This results in very good cleaning at a comparatively short total treatment time.

The invention is not limited to the example described herein, and within the scope of the invention many variations and modifications are possible to those skilled in the art. For example, it is noted that the method can be applied with particular advantage to so-termed spray tools. In said spray tools, a cleaning step is carried out comparatively rapidly. Such a device is also particularly suitable for the modification wherein an "acid" cleaning step is combined with a cleaning step using hot demineralized water.

It is further noted that materials other than those used in the examples may be applied within the scope of the invention. It is also possible to apply different deposition techniques for the above-mentioned, or other, materials, such as epitaxy, CVD (=Chemical Vapor Deposition), sputtering and vapor deposition. Instead of dry-etch methods, use may sometimes be made of wet-chemical etch techniques, and conversely. Although a method in accordance with the invention is suited, in particular, for the manufacture of ICs, it may also be advantageously applied in the production of discrete semiconductor devices.

The apparatus 100 for use in a method according to the invention, shown in FIG. 10, comprises a reservoir 101 with concentrated sulphuric acid, such as e.g. 98% aqueous solution of sulphuric acid, and a supply 102 of demineralized water. A mixing unit 103 such as e.g. a low-flow pick-up meter is connected to the reservoir 101 and to the supply 102 to enable mixing of sulphuric acid provided by the reservoir 101 and demineralized water provided by the supply 102. The cleaning agent thereby obtained is provided to a cleaning station 104 which may be a wet bench tool or a spray tool. In operation the cleaning station 104 receives the semiconductor body 11 and the cleaning agent as provided by the mixing unit 103. The cleaning station 104 is arranged to bring the semiconductor body 11 in contact with the cleaning agent thereby achieving the cleaning of the semiconductor body 11.

In an embodiment, the mixing unit 103 is arranged to mix exclusively sulphuric acid and demineralized water. Preferably, the mixing unit 103 is arranged for mixing of sulphuric acid between 0.01 and 10% by weight, and preferably between 0.5 and 5% by weight with demineralized water.

The invention claimed is:

1. A method of manufacturing a semiconductor device with a substrate and a semiconductor body which comprises at least one active semiconductor element, wherein, after the semiconductor element has been formed, a layered structure is provided comprising at least one electrically insulating layer or one electrically conductive layer, wherein an opening is formed in the layered structure by means of a patterned photoresist layer and an etch process, wherein residues are formed at the surface of the semiconductor body during the etch process, wherein the photoresist layer is ashed, after the etch process, by means of a treatment with an oxygen-containing compound, after which the surface of the semiconductor body is cleaned using a cleaning agent containing a diluted solution of sulphuric acid and phosphoric acid in demineralized water, and being heated to a temperature above room temperature, as a result of which the residues formed are removed from the surface, characterized in that sulphuric acid is chosen for the acid in the cleaning agent, wherein the phosphoric acid concentration is chosen to range between 0.01 and 5% by weight.

2. The method of claim 1, wherein the phosphoric acid in the cleaning agent has a concentration between 0.01 and 5% by weight, and the sulphuric acid in the cleaning agent has a concentration between 0.01 and 10% by weight.

3. A method of manufacturing a semiconductor device with a substrate and a semiconductor body which comprises at least one active semiconductor element, wherein, after the semiconductor element has been formed, a layered structure is provided comprising at least one electrically insulating layer or one electrically conductive layer, wherein an opening is formed in the layered structure by means of a patterned photoresist layer and an etch process, wherein residues are formed at the surface of the semiconductor body during the etch process, wherein the photoresist layer is ashed, after the etch process, by means of a treatment with an oxygen-containing compound, after which the surface of the semiconductor body is cleaned using a cleaning agent containing a diluted solution of an acid in water and being heated to a temperature above room temperature, as a result of which the residues formed are removed from the surface, characterized in that the cleaning agent contains only a diluted solution of sulphuric acid in water, wherein the temperature is chosen in the range between 20 and 60° C.

4. A method of manufacturing a semiconductor device having a semiconductor body, the method comprising:
   forming at least one active semiconductor element in the semiconductor body;
   after the semiconductor element has been formed, forming an insulating layer on the semiconductor body;
   forming a conductive layer on the insulating layer;
   forming a patterned photoresist layer on the conductive layer;
   etching an opening in the conductive layer using the patterned photoresist layer, wherein residues are formed at a surface of the semiconductor body during the etching; and
   cleaning the semiconductor body using a cleaning agent to remove the residues while heating the semiconductor body to a temperature above room temperature, the cleaning agent containing a diluted solution of sulphuric acid and phosphoric acid in water.

5. The method of claim 4, wherein the phosphoric acid in the cleaning agent has a concentration between 0.01 and 5% by weight, and the sulphuric acid in the cleaning agent has a concentration between 0.01 and 10% by weight.

6. The method of claim 4, further comprising, after the step of cleaning, rinsing the semiconductor body with demineralized water.

7. The method of claim 6, wherein the steps of cleaning and rinsing are repeated at least three times.

8. A method of manufacturing a semiconductor device having a semiconductor body, the method comprising:
   forming at least one active semiconductor element in the semiconductor body;
   after the semiconductor element has been formed, forming a first insulating layer on the semiconductor body;
   forming a first metal layer on the insulating layer;
   forming a second metal layer on the first metal layer;
   forming a second insulating layer on the second metal layer;
   forming a patterned photoresist layer on the second insulating layer;
   etching an opening in second insulating layer using the patterned photoresist layer, wherein residues are formed on walls of the opening during the etching; and
   cleaning the semiconductor body using a cleaning agent to remove the residues while heating the semiconductor body to a temperature above room temperature, the cleaning agent containing a diluted solution of sulphuric acid in water.

9. The method of claim 8, further comprising:

after removing the residues, covering the walls of the opening with a barrier layer and filling the opening with metal to form a via;

forming a third metal layer on the second insulating layer and on the via;

etching the third metal layer, wherein further residues are formed during the etching of the third metal layer; and cleaning the semiconductor body using the cleaning agent to remove the further residues.

10. The method of claim 8, wherein the cleaning agent contains only a diluted solution of sulphuric acid in water.

11. The method of claim 8, wherein the cleaning agent contains a diluted solution of sulphuric acid and phosphoric acid in demineralized water.

12. The method of claim 11, wherein the phosphoric acid in the cleaning agent has a concentration between 0.01 and 5% by weight, and the sulphuric acid in the cleaning agent has a concentration between 0.01 and 10% by weight.

13. The method of claim 8, further comprising, after the step of cleaning, rinsing the semiconductor body with demineralized water.

14. The method of claim 13, wherein the steps of cleaning and rinsing are repeated at least three times.

* * * * *